(12) United States Patent
Wieczorek et al.

(10) Patent No.: US 6,492,210 B2
(45) Date of Patent: Dec. 10, 2002

(54) METHOD FOR FULLY SELF-ALIGNED FET TECHNOLOGY

(75) Inventors: Karsten Wieczorek, Boxdorf (DE); Manfred Horstmann, Dresden (DE); Rolf Stephan, Dresden (DE); Michael Raab, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/810,771

(22) Filed: Mar. 16, 2001

(65) Prior Publication Data
US 2002/0048862 A1 Apr. 25, 2002

(30) Foreign Application Priority Data
Oct. 20, 2000 (DE) .......................................... 100 52 131

(51) Int. Cl.[7] ................................................ H01L 21/00
(52) U.S. Cl. ........................ 438/149; 438/151; 438/164
(58) Field of Search .................................. 438/149–166

(56) References Cited

U.S. PATENT DOCUMENTS

| 5,346,839 A | * | 9/1994 | Sundaresan | 438/164 |
| 5,407,837 A | | 4/1995 | Eklund | 437/21 |
| 5,482,871 A | * | 1/1996 | Pollack | 257/347 |

FOREIGN PATENT DOCUMENTS

| DE | 197 47 777 A1 | 10/1997 | H01L/21/336 |
| EP | 0 344 863 A1 | 12/1989 | H01L/21/84 |

* cited by examiner

Primary Examiner—Jey Tsai
(74) Attorney, Agent, or Firm—Williams, Morgan & Amerson, P.C.

(57) ABSTRACT

This invention provides methods of forming a field-effect transistor in an integrated circuit using self-aligning technology on the basis of a gate electrode and sidewall spacer masking procedure both for forming the device isolation features and the source and drain regions. This invention enables an increase of the integration-density of semiconductor devices, a minimization of the parasitic capacitances in field-effect transistor devices, and a quicker manufacturing process.

32 Claims, 3 Drawing Sheets

METHOD FOR FULLY SELF-ALIGNED FET TECHNOLOGY

BACKGROUND OF THE INVENTION

1. Field of the Invention

The present invention relates to a method of producing a semiconductor device using sidewall spacers to obtain alignment of overlying device features. The present invention in particular relates to a method of producing a field-effect transistor using sidewall spacers on a semiconductor substrate for adjusting the position of an active region with respect to a gate electrode without realigning steps during the production process.

2. Description of the Related Art

The manufacturing process of integrated circuits involves the fabrication of numerous insulated gate field-effect transistors, such as metal-oxide semiconductor field-effect transistors (MOSFETs). In order to increase integration density and improve device performance, for instance, with respect to signal processing time and power consumption, feature sizes of the transistor structures are steadily decreasing. Most importantly, not only the gate length but also the length of the active region of the fabricated transistors needs to be reduced to comply with these requirements in order to reduce parasitic source and drain capacitances.

Conventionally, device features are defined and delineated by lithographic techniques, in particular photolithography, preferably using a high numerical aperture lens and a deep ultraviolet (DUV) light source. Current DUV lithography reaches its resolution limit at a feature size of approximately 0.2 $\mu$m. Together with emerging gate length trim-techniques it is possible to reach device features in the sub-100 nm region. Such feature definition by lithography requires a plurality of process steps, each usually involving a resist mask technique. Overlay alignment of subsequent resist masks using special alignment features on the semiconductor substrate requires exact positioning of a mechanical stage supporting the substrate. Desirably, the overlay accuracy is considerably higher than the smallest feature size, preferably, at least one order of magnitude.

However, mechanical alignment of the various resist mask layers necessary for production of a field-effect transistor (FET) structure having a gate length of approximately 0.1 $\mu$m is very difficult to achieve due to the mechanical nature of the overlay alignment process.

To comply with the general requirements of mass production of semiconductor devices any new technology must conserve the current standards of efficiency, reliability, and cost of already existing methods or provide improvements in this respect.

As mentioned above, the formation of the active region relative to the gate electrode is a critical step in the manufacturing process of a field-effect transistor. The gate length dimension, i.e., the lateral extension of the gate electrode between the source region and drain region of the field-effect transistor, is commonly known as critical dimension of the gate. This critical dimension is desirably reduced to sizes approaching or even exceeding the resolution limit of the optical imaging systems used for patterning the device features. In a field-effect transistor such as a MOSFET, the gate is used to control an underlying channel formed in the semiconductor substrate between source region and drain region. Channel, source region, and drain region are formed in, on, or over a semiconductor substrate which is doped inversely to the drain and source regions. The gate electrode is separated from the channel, the source region, and the drain region, by a thin insulating layer, generally by an oxide layer. Additionally, device insulation features are necessary to ensure electrical isolation between neighboring field-effect transistors in integrated circuits.

During operation of such a MOSFET, a voltage is supplied to the gate electrode in order to create an electric field between the gate electrode and the source and drain regions affecting conductivity in the channel region of the substrate. Besides the desired transistor current control function, the gate electrode, the gate insulation layer, and the regions under-lying the gate insulation layer, also act as a capacitor generating a parasitic capacitance. The amount of this parasitic capacitance depends on the feature size of the gate electrode. Most commonly in integrated circuit applications, the transistors are operated in a switching mode with clock frequencies currently as high as 400 to 500 MHz. In this operation mode, the gate capacitor has to be continuously charged and discharged, which significantly affects signal performance and power consumption of the device.

Moreover, the electric field between the source region and the drain region generates an additional parasitic capacitance. The amount of this additional parasitic capacitance depends on the sizes of the source region and of the drain region. This additional parasitic capacitance also significantly affects signal performance and power consumption of the semiconductor device. Decreasing sizes of the source region and of the drain region will reduce the additional parasitic capacitance. Decreasing source and drain regions, however, require difficult aligning steps during the photolithography for patterning the gate electrode, and, thus, lead to a deterioration of device characteristics due to an unavoidable misalignment of the gate electrode with respect to the source and drain regions because of the mechanical nature of the alignment step.

Due to the limitations of standard photolithography including mechanical alignment used to pattern and position the gate electrode within the active transistor region in which the drain and source have to be formed, advanced techniques for trimming the gate electrode will neither be translated into a decreasing size of the active region and, thus, into reduced source and drain regions, nor into reduced source and drain capacitances nor into an increased circuit-density.

As the dimensions of the transistor significantly influence its electrical characteristics, when decreasing device dimensions it is important to provide a method of reliably and reproducibly forming and positioning device features and device insulation features in order to minimize variations in the electrical characteristics of integrated circuits.

With reference to FIGS. 1a to 1c, an illustrative example of forming a field-effect transistor according to a typical prior art process will be described. It is to be noted that FIGS. 1a to 1c as well as the following drawings in this application are merely schematic depictions of the various stages in manufacturing the illustrative device under consideration. The skilled person will readily appreciate that the dimensions shown in the figures are not true to scale and that different portions or layers are not separated by sharp boundaries as portrayed in the drawings but may instead comprise continuous transitions. Furthermore, various process steps as described below may be performed differently depending on particular design requirements. Moreover, in this description, only the relevant steps and portions of the device necessary for the understanding of the present invention are considered.

FIG. 1a shows a schematic cross-section of a field-effect transistor at a specific stage of a typical prior art manufacturing process. Within a silicon substrate 1, shallow trenches 2, e.g., made of silicon dioxide, are formed and define a transistor active region 3 in which a channel, a drain region and a source region will be formed. A gate insulation layer 4 is formed above the substrate 1. The gate insulation layer 4 may be formed by a variety of techniques, e.g., thermal growth, chemical vapor deposition (CVD), etc., and it may be comprised of a variety of materials, e.g., an oxide, an oxynitride, silicon dioxide, etc.

FIG. 1b shows a schematic cross-section of the field-effect transistor of FIG. 1a after formation of a layer of gate electrode material 5 above the gate insulation layer 4. The layer of gate electrode material 5 may be formed from a variety of materials, e.g., polysilicon, a metal, etc., and it may be formed by a variety of techniques, e.g., CVD, low-pressure chemical vapor deposition (LPCVD), sputter deposition, etc. Over the layer of gate electrode material 5 a resist feature 6 is formed. The process steps involved in patterning a layer of resist (not shown) for producing the resist feature 6 are of common knowledge to the skilled person. These steps include the formation of the layer of resist by a spin-coating process, and the employment of short exposure wavelengths such as wavelengths in the DUV range, while performing the required photolithography steps. Since these procedures are commonly known, the description thereof will be omitted.

FIG. 1c shows a schematic cross-section of the field-effect transistor of FIG. 1b after conventional etching of the layer of gate electrode material 5 and after removing all remaining parts of resist feature 6. As a result of these process steps a gate electrode 7 is obtained. Lightly doped drain (LDD) regions 10 are then formed in the active region 3 by a shallow ion implantation with a low dose before the formation of sidewall spacers 8. Next, the sidewall spacers 8 are formed adjacent the gate electrode 7. Thereafter, source and drain regions 9 are formed by a deep ion implantation with a high dose. The implanted ions are electrically activated by rapid thermal annealing (RTA). In order to form the sidewall spacers 8 adjacent to the gate electrode 7, silicon-dioxide ($SiO_2$) was blanket deposited and subsequently anisotropically etched. According to the conventional fabrication process as described above, drain and source regions 9 are limited by lightly doped drain and source regions 10, which connect to a channel 11. The transverse dimension of the gate electrode 7 defines a critical dimension 12, and the transverse dimension of the active region 3 defines a length dimension 13.

Since the source and drain regions 9 are defined by overlay alignment, i.e., mechanical alignment, in the various lithographic steps while forming the gate electrode, it is extremely difficult to decrease the length dimension 13 due to the mechanical nature of the alignment procedure. Therefore, advanced techniques for a desired down-sizing of the gate electrode 7 will not necessarily allow a corresponding scaling of the drain and source regions, and, thus, may not be translated into an increased circuit-density or into reduced source and drain capacitances.

In view of the above-mentioned problems, a need exists for an improved method for forming the source region, the drain region, and the gate electrode of field-effect transistors on semiconductor substrates and to precisely align the gate electrode within the active region.

SUMMARY OF THE INVENTION

The present invention provides methods of forming a field-effect transistor in an integrated circuit using an aligning technology on the basis of a sidewall spacer masking procedure both for forming the device isolation features and the source and drain regions.

According to a first embodiment of the invention there is provided a method of forming a field-effect transistor in an integrated circuit comprising the steps of: providing a semiconductor substrate having a surface, a buried insulating layer, and an electrically conductive layer doped with impurities between said surface and said buried insulating layer, forming a gate electrode over said surface, said gate electrode having a gate width and sidewalls along its width direction, forming first sidewall spacers having a first lateral extension along said sidewalls of said gate electrode, and removing portions of said semiconductor substrate above said buried insulating layer and adjacent said first sidewall spacers until said buried insulating layer is exposed, using said first sidewall spacers as a masking material for defining an active region.

According to a second embodiment of the invention there is provided a method of forming a field-effect transistor in an integrated circuit comprising the steps of: providing an insulating substrate with an electrically conductive layer doped with impurities above said insulating substrate, said electrically conductive layer having a surface, forming a gate electrode over said surface, said gate electrode having a gate width and sidewalls along its width direction, forming first sidewall spacers along said sidewalls of said gate electrode having a first lateral extension, and removing portions of said electrically conductive layer above said insulating substrate and adjacent said first sidewall spacers until said insulating substrate is exposed, using at least said first sidewall spacers as a masking material for defining an active region.

According to a third embodiment of the invention there is provided a method of forming a field-effect transistor in an integrated circuit comprising the steps of: providing a semiconductor substrate having a surface, a buried insulating layer, and an electrically conductive layer doped with impurities between said surface and said buried insulating layer; forming a gate electrode over said surface, said gate electrode having a gate length, a gate width and sidewalls along its width direction; forming a gate cover layer over said gate electrode and first sidewall spacers along said sidewalls of said gate electrode, said first sidewall spacers having a first lateral extension; forming a mask over said gate cover layer and first sidewall spacers exposing two opposing end-caps formed of the first sidewall spacers in both length directions of the gate electrode; removing said end-caps, thereby forming two opposing independent first sidewall spacers; removing said mask; removing material of said semiconductor substrate above said buried insulating layer and adjacent said first sidewall spacers and said gate electrode until said buried insulating layer is exposed, using said first sidewall spacers and said gate electrode as masking material for forming an active region self-aligned to said gate electrode; removing said first sidewall spacers; forming lightly doped source and drain regions by isotropic implantation of ions into said active region; forming second sidewall spacers along said sidewalls of said gate electrode having a second lateral extension which is shorter than the first lateral extension; and forming source and drain electrodes to both sides adjacent the sidewalls of said gate electrode using said gate cover layer and said second sidewall spacers as masking material.

The present invention as outlined above enables to fabricate a transistor having reduced device dimensions, wherein an active region as well as device insulation features are aligned with respect to the gate electrode without any mechanical overlay steps. With the production methods provided by this invention the active region of a field-effect transistor may be tuned to minimum desired dimensions regardless of lithographic restrictions. Consequently, a drastically increasing circuit-density and decreasing parasitic capacitances can be reached.

This invention will enable a significant reduction of field-effect transistor dimensions in integrated circuits and, therefore, a significant cost-reduction in manufacturing in semiconductor industries can be achieved.

BRIEF DESCRIPTION OF THE DRAWINGS

Further advantages and objects of the present invention will become more apparent with the following detailed description when taken with reference to the accompanying drawings in which.

Figure 1A:
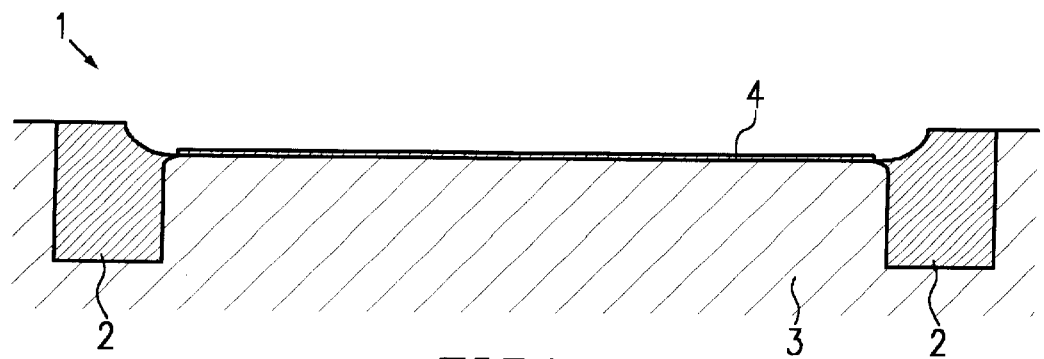
FIGS. 1a to 1c are schematic cross-sectional views of a semiconductor substrate in different process steps during production of a field-effect transistor according to the prior art.
Figure 1B:
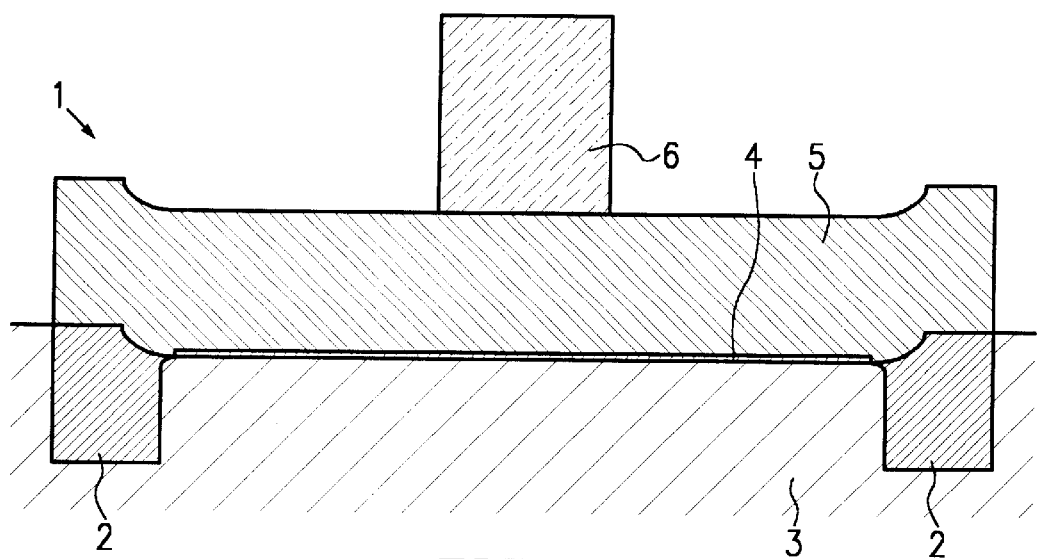
Figure 1C:
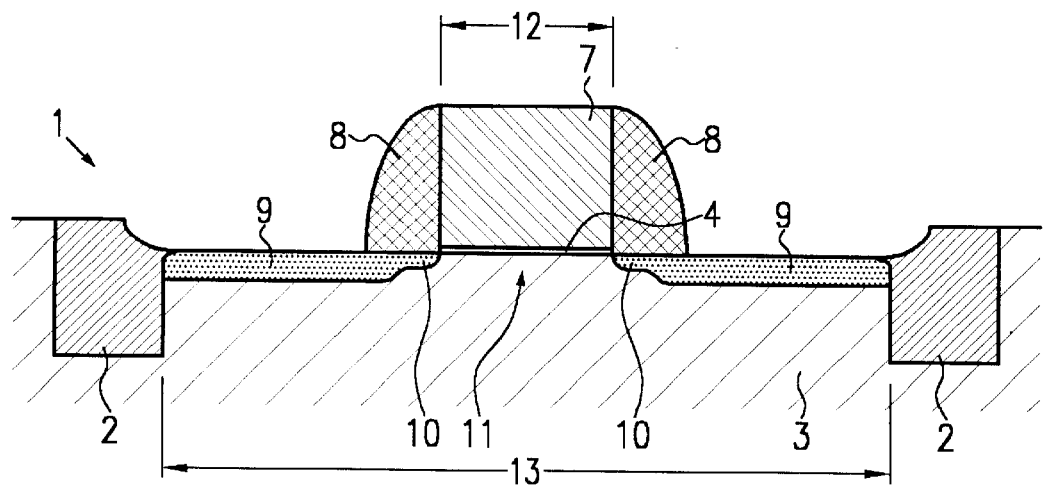

While the present invention is described with reference to the embodiment as illustrated in the following detailed description as well as in the drawings, it should be understood that the following detailed description as well as the drawings are not intended to limit the present invention to the particular embodiment disclosed, but rather the described embodiment merely exemplifies the various aspects of the present invention, the scope of which is defined by the appended claims.

DETAILED DESCRIPTION OF THE INVENTION

Further advantages and objects of the present invention will become more apparent with the following detailed description and the appended claims. Furthermore, it is to be noted that although the present invention is described with reference to the embodiments as illustrated in the following detailed description, it should be noted that the following detailed description is not intended to limit the present invention to the particular embodiments disclosed, but rather the described embodiment merely exemplifies the various aspects of the present invention, the scope of which is defined by the appended claims.

Figure 2A:
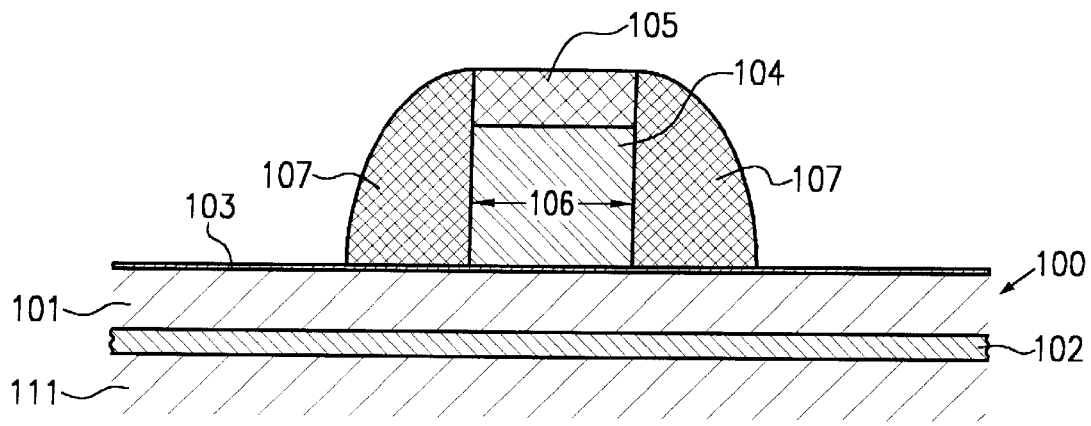
FIG. 2a is a schematic cross-sectional view of a semiconductor substrate after gate electrode formation, gate cover layer formation, and sidewall spacer formation during production of a field-effect transistor according to this invention.

With reference to FIGS. 2a to 2e, an illustrative example of forming a field-effect transistor according to one embodiment of the present invention will be described. FIG. 2a shows a schematic cross-section of a field-effect transistor at a specific stage of a manufacturing process according to the present invention. In a silicon substrate 100 a buried insulating layer 102 is built in between a support substrate 111 and an electrically conductive layer 101 doped with impurities. This buried insulating layer 102 could be provided by bonding insulating layers of two initial silicon substrates together, wherein at least one of said initial silicon substrates comprises an electrically conductive layer doped with impurities and an insulating layer above said electrically conductive layer. This process results in the formation of a silicon substrate 100 having a surface, a buried insulating layer 102, a support substrate 111, and an electrically conductive layer 101 doped with impurities between said surface and said buried insulating layer 102. The process steps involved in bonding semiconductor substrates are of common knowledge to the skilled person and, therefore, description thereof will be omitted. Other production processes for such a silicon substrate 100 having a buried insulating layer 102, such as deep oxide implantation, or epitaxial growth of an insulating layer followed by an electrically conductive layer on an initial semiconductor layer, etc., are also possible and known to the person skilled in the art.

The transistor shown in FIG. 2a is comprised of a gate insulation layer 103 formed over the substrate 100, a gate electrode 104 (having a gate length 106), a gate cover layer 105 (comprised of, for example, silicon nitride) and a sidewall spacer 107. The structure shown in FIG. 2a may be formed in accordance with the following illustrative process flow. Over the silicon substrate 100 a thin gate insulation layer 103 is blanket deposited. Next, a layer (not shown) comprised of the gate electrode material and a cover layer (not shown) (comprised of, for example, silicon nitride) are formed above the gate insulation layer 103. Thereafter, the layer of gate electrode material and cover layer are patterned using known photolithography and etching techniques to define the gate electrode 104 and the cover layer 105. The gate electrode 104 covered by the cover layer 105 has steep sidewalls 118 around its circumference. Thereafter, sidewall spacers 107 comprising silicon-nitride (SiN) are formed around the gate electrode 104 and the cover layer 105. The process steps involved in patterning a resist (not shown) and for producing the gate electrode 104, the cover layer 105, and the sidewall spacers 107 are of common knowledge to the skilled person, and usually include the employment of short exposure wavelengths such as wavelengths in the DUV range while performing the required photolithography steps. According to the anisotropic etching necessary for formation of the sidewall spacers 107, due to a relation of sidewall height to spacer thickness at the bottom, depending on the slope of the sidewall spacers 107, their lateral extension can be determined by the thickness of the cover layer 105. Hence, by increasing the sidewall height, substantially thicker sidewall spacers 107 can be formed, employing a standard anisotropic etch process for sidewall spacer formation, which otherwise is commonly known, so that the detailed description thereof will be omitted.

Figure 2B:
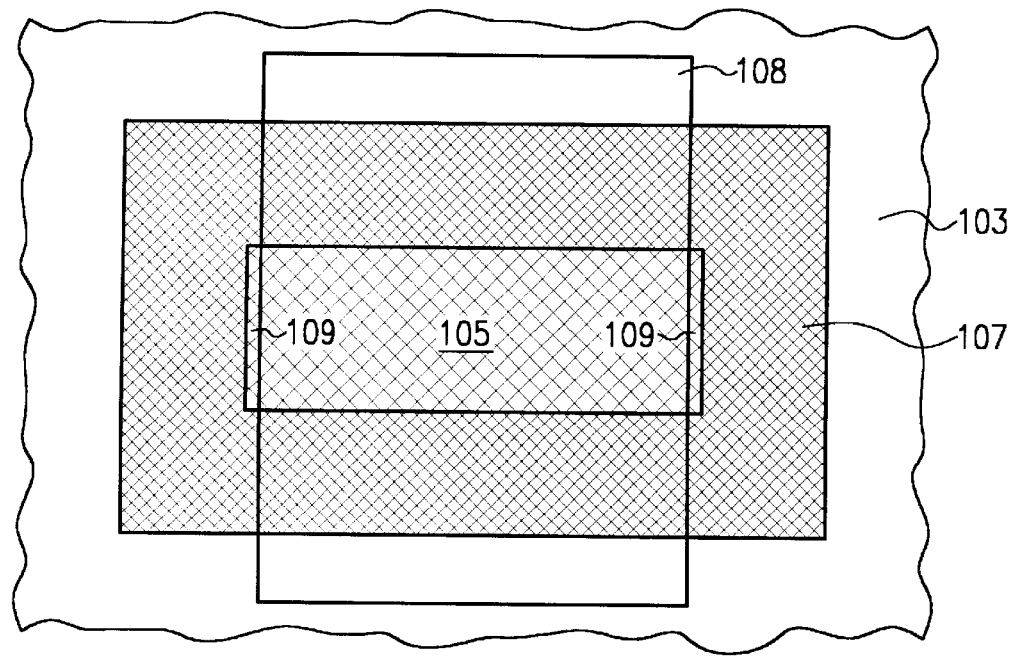
FIG. 2b is a schematic top view of the semiconductor substrate after forming a mask over the gate cover layer and the sidewall spacers during production of the field-effect transistor according to this invention.

FIG. 2b shows a schematic top view of the field-effect transistor of FIG. 2a after deposition of a mask 108 over the cover layer 105, over the sidewall spacers 107, and over the thin gate insulation layer 103. The deposition of the mask 108 is made such that just both end-caps 109 of the cover layer 105 and all remaining parts of the sidewall spacers 107 around the end-caps 109 are exposed. All exposed parts have to be selectively removed until the thin gate insulation layer 103 is exposed (not shown) resulting in two opposing sidewall spacers 107 in both directions of the gate length 106.

Figure 2C:
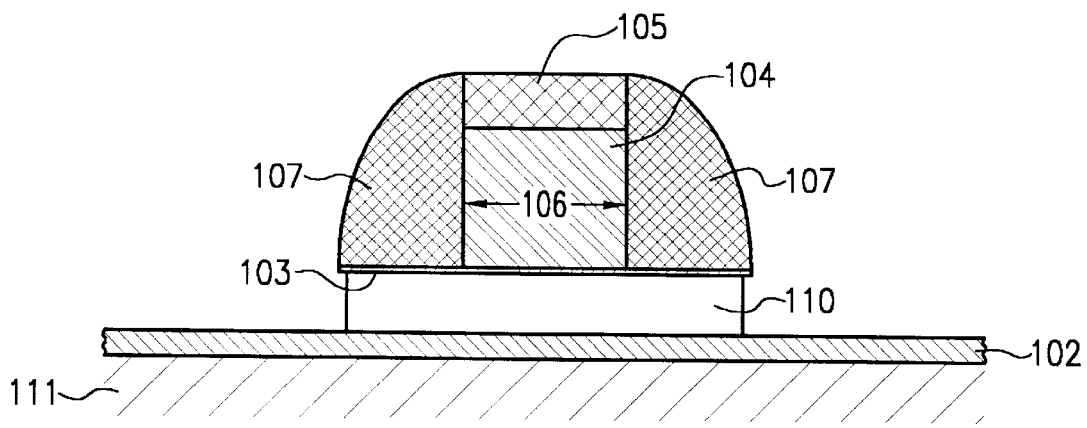
FIG. 2c is a schematic cross-sectional view of the semiconductor substrate after active region formation and mask removal during production of the field-effect transistor according to this invention.

FIG. 2c shows a schematic cross-section of the field-effect transistor of FIG. 2b after conventional etching all parts of the thin gate insulation layer 103 as well as the substrate 100, which are not covered with the cover layer 105 or the sidewall spacers 107, until the buried insulating layer 102 is reached. This etching step forms an active region 110 from the electrically conductive layer 101 over the buried insulating layer 102. Due to the buried insulating layer 102 silicon trench isolations (STIs) are not necessary.

Figure 2D:
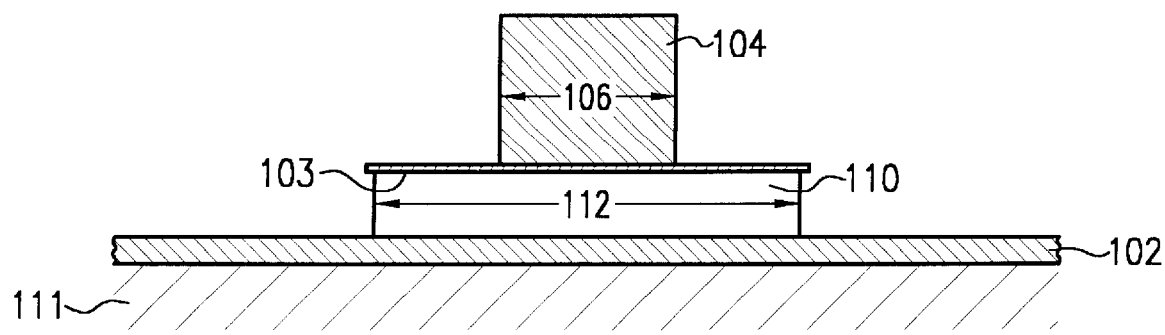
FIG. 2d is a schematic cross-sectional view of the semiconductor substrate after sidewall spacer removal and gate cover layer removal during production of the field-effect transistor according to this invention.

FIG. 2d shows a schematic cross-section of the field-effect transistor of FIG. 2c after removing the cover layer 105 and the sidewall spacers 107. According to the present invention, the length dimension 112 is completely determined by etching and deposition processes without necessitating critical overlay steps during the photolithography technique as required in conventional methods. Moreover, the active region 110 is formed by etching of the conductive layer 101 using the sidewall spacers, which were previously formed adjacent the gate electrode, as a mask. Thus, due to the method described active region 110 is formed such that gate electrode 104 is substantially centrally positioned above active region 110. The characteristic of positioning a device feature with respect to another feature without an "external" mechanical positioning step, i.e., without an additional overlay step, will hereinafter referred to as a self-alignment technique and the feature accordingly formed will be referred to as a self-aligned feature.

Figure 2E:
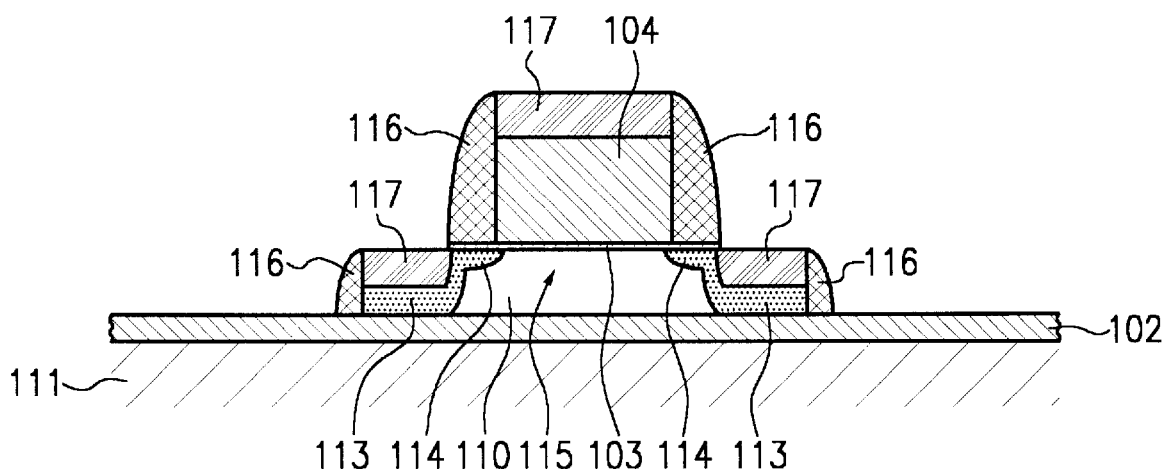
FIG. 2e is a schematic cross-sectional view of the semiconductor substrate after completion of the field-effect transistor according to this invention.

FIG. 2e shows a schematic cross-section of the field-effect transistor of FIG. 2d after conventional device processing performed to complete the field-effect transistor. The thin gate insulation layer 103 not covered by the gate electrode 104 was removed by etching. Lightly doped drain (LDD) and source regions 114 were formed in the active region 110 by a shallow ion implantation with a low dose. The implanted ions are diffused by rapid thermal annealing (RTA) so as to partially extend in the area below the thin gate insulation layer 103. Silicon dioxide ($SiO_2$) was blanket deposited and subsequently anisotropically etched in order to form sidewall spacers 116 adjacent to the gate electrode 104 and to the lightly doped drain and source regions 114. Thereafter, source and drain regions 113 are completed by a deep ion implantation with a high dose. The source and drain regions 113 are limited by the lightly doped drain and source regions 114, which connect to a channel 115. Finally, contacts 117 for the gate electrode 104 and for the drain and source regions 113 are formed, e.g., by silicide processing.

After the formation of the gate electrode 104, the gate insulation layer 103, and the active region 110 manufacturing of the field-effect transistor is continued by commonly known standard techniques. The production steps for these standard techniques are not described in detail in this description, because they are not essential for the present invention.

The procedure of this invention provides a self-alignment technique for forming of the active region after the formation of the gate electrode without the need of a separate aligning step. Due to the fact that around the active region the substrate is etched down until the buried insulating layer is reached, silicon trench isolations (STIs) are unnecessary according to this invention.

Due to the self-aligned active region 110, the length dimension 112 of the active region 110 may be formed to minimum desired dimensions regardless of lithographic restrictions. Therefore, a significant increase of circuit-density and decrease of parasitic capacitances is reached. Furthermore, the production of field-effect transistors according to the present invention requires less photolithography masks as compared to conventional processing.

According to a modification of the above described embodiment of the present invention, the first sidewall spacers 107 are formed without the gate cover layer 105 over the gate electrode 104. In order to achieve sidewall spacers 107 of sufficient bottom thickness for defining the active region 110, the process for depositing the spacer material and/or the anisotropic etch process for forming the sidewall spacers 107 is accordingly adjusted to lead to spacer flanks of a shallower slope so as to achieve a greater thickness to height ratio of the sidewall spacers 107. Preferably, the bottom thickness of the sidewall spacers is in the order of the gate length, or even beyond, so as to obtain a high circuit density. It is to be noted, however, that deposition and etching techniques are well-established and allow thickness control of material layers within a range from few nm to at least several $\mu$m, and therefore, any desired bottom thickness and, thus, length dimension 112, is achievable by the present invention.

According to another modification of the above described embodiment of the present invention, the sidewall spacers 107 are not removed after the formation of the active region 110. In this case the sidewall spacers 107 are trimmed, e.g., by an etch process, yielding sidewall spacers 116 having a shorter lateral extension than the sidewall spacers 107. Afterwards, the lightly doped drain and source regions 114 are formed in the active region 110 under said sidewall spacers 116 by diffusion of ions or by oblique ion implantation with a low dose. Thereafter, source and drain regions 113 are formed by a deep ion implantation with a high dose. The remaining production steps according to the above-mentioned embodiment described with respect to the drawings keep the same.

According to a further modification of the above described embodiment of the present invention, the initial substrate is provided as an insulating substrate 102 with an electrically conductive layer 101 above the insulating substrate 102. This electrically conductive layer 101 has to be doped with impurities and is obtainable by, e.g., an epitaxial growth method, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a field-effect transistor in an integrated circuit comprising the steps of:
   (a) providing a semiconductor substrate having a surface, a buried insulating layer, and an electrically conductive layer doped with impurities between said surface and said buried insulating layer;
   (b) forming a gate electrode over said surface, said gate electrode having a gate width, a gate length that corresponds to a final critical dimension of said gate electrode, and sidewalls along its width direction;
   (c) forming first sidewall spacers having a first lateral extension along said sidewalls of said gate electrode; and (d) removing portions of said semiconductor substrate above said buried insulating layer and adjacent said first sidewall spacers until said buried insulating layer is exposed, using said first sidewall spacers as a masking material for defining an active region.

2. A method according to claim 1, wherein step (a) of claim 1 further comprises:
(a1) providing initial semiconductor substrates, at least one of said initial semiconductor substrates comprising an electrically conductive layer doped with impurities and an insulating layer above said electrically conductive layer; and
(a2) bonding insulating layers of two of said initial semiconductor substrates, thereby forming a semiconductor substrate having a surface, a buried insulating layer, and an electrically conductive layer doped with impurities between said surface and said buried insulating layer.

3. A method according to claim 1, wherein step (a) of claim 1 further comprises:
(a3) providing an initial semiconductor substrate;
(a4) growing an insulating layer above said initial semiconductor substrate; and
(a5) growing an electrically conductive layer doped with impurities above said insulating layer, thereby forming a semiconductor substrate having a surface, a buried insulating layer, and an electrically conductive layer doped with impurities between said surface and said buried insulating layer.

4. A method according to claim 3, wherein steps (a4) and (a5) of claim 3 comprise an epitaxial growth method.

5. A method according to claim 3, wherein steps (a4) and (a5) of claim 3 comprise a chemical vapor deposition method.

6. A method according to claim 1, further comprising forming source and drain regions in said active region.

7. A method according to claim 6, wherein forming said source and drain electrodes comprises trimming said first sidewall spacers to form second sidewall spacers having a second lateral extension which is less than said first lateral extension.

8. A method according to claim 7, wherein lightly doped source and drain regions are formed by oblique implantation of ions under said second sidewall spacers.

9. A method according to claim 7, wherein lightly doped source and drain regions are formed by diffusion of ions under said second sidewall spacers.

10. A method according to claim 6, wherein forming said source and drain electrodes comprises removing said first sidewall spacers and forming second sidewall spacers along said sidewalls of said gate electrode having a second lateral extension which is less than said first lateral extension.

11. A method according to claim 10, wherein between removing said first sidewall spacers and forming said second sidewall spacers lightly doped source and drain regions are formed by implantation of ions at low dose and energy into said active region.

12. A method according to claim 1, wherein step a) of claim 1 includes forming a gate cover layer above said gate electrode, thereby adjusting a height of the sidewall spacers.

13. A method according to claim 12, wherein said gate cover layer is removed after forming source and drain regions.

14. A method according to claim 1, further comprising removing substantially all of said sidewall spacer except portions along a width of said gate electrode prior to performing step (d).

15. A method according to claim 14, wherein removing said sidewall spacer includes pattering a lithographic mask over said gate electrode and said first sidewall spacers and etching all exposed parts not covered by the lithographic mask.

16. A method according to claim 15, further comprising removing material of said semiconductor substrate above said buried insulating layer until said buried insulating layer is exposed, thereby using said sidewall spacer and at least one of the gate electrode and a gate cover layer positioned above said gate electrode as a masking material.

17. A method of forming a field-effect transistor in an integrated circuit comprising the steps of:
(a) providing an insulating substrate with an electrically conductive layer doped with impurities above said insulating substrate, said electrically conductive layer having a surface;
(b) forming a gate electrode over said surface, said gate electrode having a gate width, a gate length that corresponds to a final critical dimension of said gate electrode, and sidewalls along its width direction;
(c) forming first sidewall spacers along said sidewalls of said gate electrode having a first lateral extension; and
(d) removing portions of said electrically conductive layer above said insulating substrate and adjacent said first sidewall spacers until said insulating substrate is exposed, using at least said first sidewall spacers as a masking material for defining an active region.

18. A method according to claim 17, further comprising forming source and drain regions in said active region.

19. A method according to claim 18, wherein forming said source and drain electrodes comprises trimming said first sidewall spacers to form second sidewall spacers having a second lateral extension which is shorter than said first lateral extension.

20. A method according to claim 19, wherein lightly doped source and drain regions are formed by oblique implantation of ions under said second sidewall spacers.

21. A method according to claim 19, wherein lightly doped source and drain regions are formed by diffusion of ions under said second sidewall spacers.

22. A method according to claim 18, wherein forming said source and drain electrodes comprises removing said first sidewall spacers and forming second sidewall spacers along said sidewalls of said gate electrode having a second lateral extension which is less than said first lateral extension.

23. A method according to claim 20, wherein between removing said first sidewall spacers and forming said second sidewall spacers lightly doped source and drain regions are formed by implantation of ions at low dose and energy into said active region.

24. A method according to claim 17, wherein step (a) of claim 17 includes forming a gate cover layer above said gate electrode, thereby adjusting a height of the sidewall spacers.

25. A method according to claim 24, wherein said gate cover layer is removed after forming source and drain regions.

26. A method according to claim 17, further comprising removing substantially all of said sidewall spacer except portions along a width of said gate electrode prior to performing step (d).

27. A method according to claim 26, wherein removing said sidewall spacer includes pattering a lithographic mask over said gate electrode and said first sidewall spacers and etching all exposed parts not covered by the lithographic mask.

28. A method according to claim 27, further comprising removing material of said semiconductor substrate above said buried insulating layer until said buried insulating layer is exposed, thereby using said sidewall spacer and at least one of the gate electrode and a gate cover layer positioned above said gate electrode as a masking material.

29. A method of forming a field-effect transistor in an integrated circuit comprising the steps of:
   (a) providing a semiconductor substrate having a surface, a buried insulating layer, and an electrically conductive layer doped with impurities between said surface and said buried insulating layer;
   (b) forming a gate electrode over said surface, said gate electrode having a gate length, a gate width and sidewalls along its width direction;
   (c) forming a gate cover layer over said gate electrode and first sidewall spacers along said sidewalls of said gate electrode, said first sidewall spacers having a first lateral extension;
   (d) forming a mask over said gate cover layer and first sidewall spacers exposing two opposing end-caps formed of the first sidewall spacers in both length directions of the gate electrode;
   (e) removing said end-caps, thereby forming two opposing independent first sidewall spacers;
   (f) removing said mask;
   (g) removing material of said semiconductor substrate above said buried insulating layer and adjacent said first sidewall spacers and said gate electrode until said buried insulating layer is exposed, using said first sidewall spacers and said gate electrode as masking material for forming an active region self-aligned to said gate electrode;
   (h) removing said first sidewall spacers;
   (i) forming lightly doped source and drain regions by isotropic implantation of ions into said active region;
   (j) forming second sidewall spacers along said sidewalls of said gate electrode having a second lateral extension which is shorter than said first lateral extension; and
   (k) forming source and drain electrodes to both sides adjacent the sidewalls of said gate electrode using said gate cover layer and said second sidewall spacers as masking material.

30. A method of forming a field-effect transistor in an integrated circuit comprising the steps of:
   (a) providing a semiconductor substrate having a surface, a buried insulating layer, and an electrically conductive layer doped with impurities between said surface and said buried insulating layer;
   (b) forming a gate electrode over said surface, said gate electrode having a gate width and sidewalls along its width direction;
   (c) forming first sidewall spacers having a first lateral extension along said sidewalls of said gate electrode;
   (d) removing portions of said semiconductor substrate above said buried-insulating layer and adjacent said first sidewall spacers until said buried insulating layer is exposed, using said first sidewall spacers as a masking material for defining an active region; and
   (e) forming source and drain regions in said active layer adjacent said sidewall of said gate electrode as originally formed.

31. A method of forming a field-effect transistor in an integrated circuit comprising the steps of:
   (a) providing a semiconductor substrate having a surface, a buried insulating layer, and an electrically conductive layer doped with impurities between said surface and said buried insulating layer;
   (b) forming a gate electrode over said surface, said gate electrode having a gate width and sidewalls along its width direction;
   (c) forming first sidewall spacers having a first lateral extension along said sidewalls of said gate electrode; and
   (d) removing substantially all of said sidewall spacer except portions along the width of said gate electrode;
   (e) after performing step (d), removing portions of said semiconductor substrate above said buried insulating layer and adjacent said first sidewall spacers until said buried insulating layer is exposed, using said first sidewall spacers as a masking material for defining an active region; and
   (f) forming source and drain regions in said active layer adjacent said sidewall of said gate electrode as originally formed.

32. A method of forming a field-effect transistor in an integrated circuit comprising the steps of:
   (a) providing a semiconductor substrate having a surface, a buried insulating layer, and an electrically conductive layer doped with impurities between said surface and said buried insulating layer;
   (b) forming a gate electrode over said surface, said gate electrode having a gate width, a gate length that corresponds to a final critical dimension of said gate electrode, a thickness that corresponds to a final desired thickness of said gate electrode, and sidewalls along its width direction;
   (c) forming first sidewall spacers having a first lateral extension along said sidewalls of said gate electrode; and
   (d) removing portions of said semiconductor substrate above said buried insulating layer and adjacent said first sidewall spacers until said buried insulating layer is exposed, using said first sidewall spacers as a masking material for defining an active region.

* * * * *